United States Patent [19]

Fukai

[11] Patent Number: 5,668,701
[45] Date of Patent: Sep. 16, 1997

[54] UP-DOWN TUNER HAVING A GROUNDING PLATE PROVIDED WITH GENERALLY L-SHAPED SOLDERING PORTIONS

[75] Inventor: Seiichirou Fukai, Kishiwada, Japan

[73] Assignee: Sharp Kabushiki Kaisha, Osaka, Japan

[21] Appl. No.: 508,046

[22] Filed: Jul. 27, 1995

[30]  Foreign Application Priority Data

Jul. 27, 1994 [JP] Japan .................................. 6-175533

[51] Int. Cl.$^6$ ................................................. H05K 9/00
[52] U.S. Cl. .......................... 361/816; 361/800; 361/796; 361/799; 361/743; 361/753; 361/752
[58] Field of Search .................... 361/753, 799, 361/800, 816, 818, 775, 743, 796; 455/301; 257/728; 174/35 R, 35 GC, 51; 334/85; 439/92, 607, 609

[56]  References Cited

U.S. PATENT DOCUMENTS

| 4,649,461 | 3/1987 | Matsuta | 361/799 |
| 4,903,169 | 2/1990 | Kitagawa et al. | 361/818 |
| 5,377,081 | 12/1994 | Bizen et al. | 361/818 |

*Primary Examiner*—Leo P. Picard
*Assistant Examiner*—Anthony Dinkins

[57]  ABSTRACT

In an up-down tuner in which a printed wiring board and a metal chassis penetrating a slit formed in the printed wiring board are bonded by solder with each other, a grounding plate provided with soldering portions having an approximately L-shaped profile is incorporated in an engaged state with the metal chassis. The printed wiring board and the metal chassis are soldered to each other via the soldering portions.

21 Claims, 11 Drawing Sheets

Fig.5A
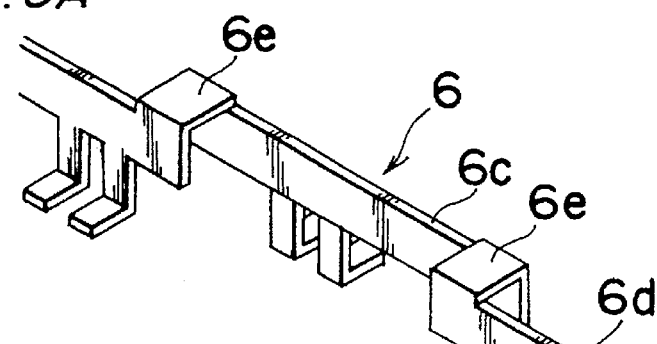
Fig.5B
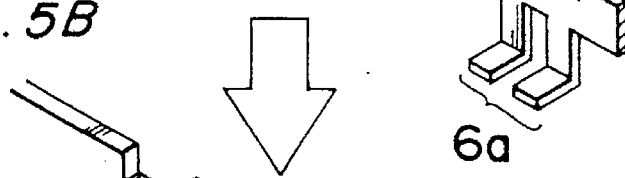
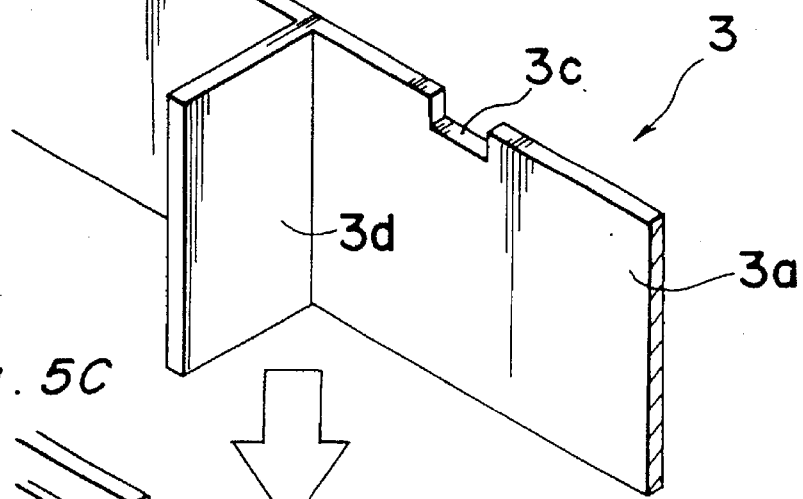
Fig.5C
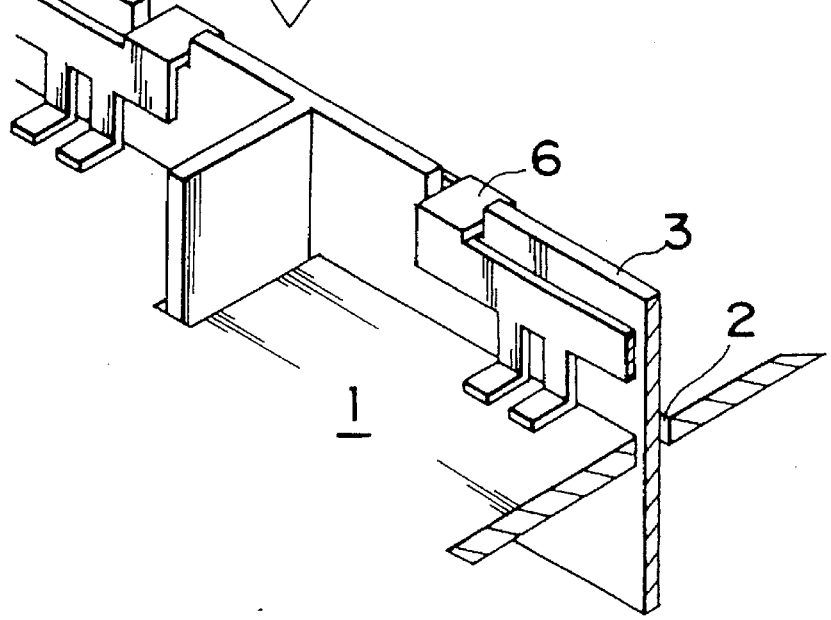

Fig. 7

| Representative Spurious Frequency Relations | Prior Art (S/I Ratio) Without Grounding Plate | Embodiment (S/I Ratio) With Grounding Plate | Degree Of Improvement (S/I Ratio) |
|---|---|---|---|
| fosc1 × 2 − fosc2 × 3 = IF<br>1387 MHz × 2<br>− 910 MHz × 3 = 44 MHz | 70 dB | 80 dB | 10 dB |
| fosc1 × 3 − fosc2 × 4 = IF<br>1228 MHz × 3<br>− 910 MHz × 4 = 44 MHz | 77 dB | 84 dB | 7 dB |
| fosc1 × 4 − fosc2 × 5 = IF<br>1148 MHz × 4<br>− 910 MHz × 5 = 42 MHz | 82 dB | 87 dB | 5 dB | fosc1 = First Local Oscillation Frequency = 1011-1701 MHz
fosc2 = Second Local Oscillation Frequency = 910 MHz
IF = IF Frequency (P: 45.75 MHz, S: 41.25 MHz) = 40-46 MHz

UP-DOWN TUNER HAVING A GROUNDING PLATE PROVIDED WITH GENERALLY L-SHAPED SOLDERING PORTIONS

BACKGROUND OF THE INVENTION

1. Field of the Invention

The present invention relates to an up-down tuner for use mainly in home terminals, CATV devices for multimedia use, TVs, and VTRs.

2. Description of the Prior Art

FIG. 9 is a block diagram of a prior art up-down tuner. FIG. 10 is a block diagram of a generic tuner. FIGS. 11 and 12 are plan views showing concrete structures of the up-down tuner of FIG. 9 and the tuner of FIG. 10, respectively.

In FIGS. 9 and 10, BPF denotes a band-pass filter, AMP denotes an amplifier, MIX denotes a mixer, OSC denotes a local oscillator, and PLL denotes a phase locked loop.

In general, an up-down tuner has two local oscillation circuits unlike a generic tuner, as is evident by a comparison of FIG. 10 with FIG. 11. Therefore, the up-down tuner tends to incur a slight deviation of an oscillation frequency and a spurious interference due to an input signal and two local oscillation signals. The spurious interference is defined as follows. In an electronic radio wave radiated to the space from a transmitter or another electronic device via an antenna, there are included radiation waves of unnecessary frequencies other than frequencies in the necessary bandwidth (occupied bandwidth). The unnecessary radiation waves are called "spurious". The spurious includes higher harmonics and fractional harmonic waves of a wave of a transmission frequency, a fundamental wave for frequency modulation, and higher order sideband wave frequencies. When an output stage of a transmitter has an insufficient filter characteristic for tuning, a considerable amount of spurious is radiated from the antenna, often causing interference with other communication lines. This is referred to as spurious interference. That is, in up-down tuners, the spurious interference is principally a mutual interference of two local oscillation signals in the up-down tuner.

Heretofore, a countermeasure has been taken by providing a metal chassis with an increased number of shield portions in an interior area thereof, partitioning circuits, and providing an increased number of grounding portions (soldered portions).

Practically, as shown in FIG. 11, the prior art up-down tuner is provided with a printed wiring board 1 for high-frequency components and the like, and a metal chassis 3 penetrating a slit 2 formed in the printed wiring board 1, where the printed wiring board 1 is connected by solder with the metal chassis 3 at copper foil portions (not shown) of the printed wiring board 1. In order to improve the reliability of the soldered portions of the metal chassis 3 and the printed wiring board 1, an increased amount of solder is deposited between the copper foil portions of the printed wiring board 1 and the metal chassis 3 by sufficiently amassing solder (reinforcement soldering) by means of a soldering iron or by mounting dummy chips or the like.

In FIG. 11, a reference numeral 3a denotes a shield portion of the metal chassis 3, and a reference numeral 4 denotes solder.

In FIG. 11, there are shown an RF (Radio Frequency) section 11, a first local oscillation section 12, a first local amplification section 13, a first local PLL (Phase Locked Loop) section 14, a first mixer section 15, a first IF (Intermediate Frequency) section 16, a second mixer section 17, a second local oscillation section 18, a second local PLL section 19, and a second IF section 20. As a countermeasure against the spurious interference, the above-mentioned sections are partitioned by the shield sections 3a of the metal chassis 3 and an increased number of soldered portions are provided between the printed wiring board 1 and the metal chassis 3. Circuit structure of above-mentioned sections is as shown in FIG. 9.

For comparison, the structure of the prior art generic tuner is shown in FIG. 12. In FIG. 12, components similar to those shown in FIG. 11 are denoted by same reference numerals.

FIGS. 13A, 13B, 13C and 13D are explanatory views of solder connections or joints of the prior art up-down tuner. FIG. 13A shows a solder joint achieved by solder dipping, where the solder dipping forms a thin solder joint 4 which tends to generate a crack. FIG. 13B shows a solder joint achieved by bending a part of the metal chassis 3, according to which a certain amount of solder can be secured. However, the solder joint 4 is still thin and generation of a crack is possible. FIG. 13C shows a solder joint achieved by amassing solder (reinforcement soldering) using a soldering iron, according to which generation of a crack can be prevented. In addition, FIG. 13D is a solder joint achieved through the use of a dummy chip 5, according to which a sufficient amount of solder can be secured to allow the prevention of the generation of a crack. Therefore, normally the printed wiring board 1 and the metal chassis 3 are soldered to each other by securing a sufficient amount of solder through amassing solder or mounting dummy chips or the like.

However, the measure of amassing solder or mounting dummy chips 5 which the above-mentioned prior art up-down tuner uses for the improvement of reliability, have caused a significant cost increase due to a troublesome soldering operation and the use of the dummy chips.

Furthermore, the metal chassis 3 has a cutout portion for supporting the printed wiring board 1. Therefore, the cutout portion is ineffective in shielding and consequently exerts influence on the spurious interference characteristic.

SUMMARY OF THE INVENTION

The present invention has been developed in view of the aforementioned problems, and has as an object, providing an up-down tuner capable of securing a sufficient amount of solder by arranging a grounding plate along the metal chassis, to thereby achieve a reduced spurious interference and cost reduction.

In order to accomplish the above object, the present invention provides an up-down tuner in which a printed wiring board is soldered to a metal chassis that penetrates a slit formed in the printed wiring board, comprising:

a grounding plate which is engaged with the metal chassis and which is provided with soldering portions having an approximately L-shaped profile via which the printed wiring board and the metal chassis are soldered to each other.

Since the soldering portions have an approximately L-shaped profile, an area of the soldered portion and an amount of solder are increased. Accordingly the printed wiring board and the metal chassis can be soldered to each other with high reliability.

In an embodiment, the grounding plate has a first portion extending along one side surface of the metal chassis, a second portion extending along the other side surface of the metal chassis, and a connection portion for connecting the first and second portions with each other. The connection portion is engaged with a corresponding portion of the metal chassis, and the soldering portions are formed at a lower end of each of the first and second portions.

The up-down tuner having the above-mentioned construction can easily cope with a case where portions to be soldered exist on both the opposite sides (i.e., both the front and rear surfaces) of the metal chassis. Also, the grounding plate can be extended, getting clear of a portion at which the metal chassis branches. This is achieved by partially extending the grounding plate along only one side of the metal chassis, that is, by providing either the first or second portion along the corresponding side of the metal chassis. Thus, it is possible for a single grounding plate to cover bonded portions in almost the entire area of the up-down tuner.

In an embodiment, the metal chassis has a cutout portion for retaining the printed wiring board, and the grounding plate has a shield portion in positional correspondence with at least the cutout portion. Therefore, it is possible to shield even a portion which has conventionally been unable to be shielded due to the chassis arrangement and retainment of the printed wiring board. As a result, a remarkably improved shielding effect can be achieved.

In an embodiment, the soldering portion of the grounding plate is comprised of two spaced nails. In another embodiment, the soldering portion of the grounding plate is provided with a through hole. In any case, the soldering portion has a configuration appropriate for increasing the soldering area, and application of a remarkably increased amount of solder is secured. This improves the solder bonding strength between the printed wiring board and the metal chassis. As a result, the possible generation of solder cracks accompanying thermal cycles can be suppressed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 5A, 5B, and 5C are perspective views for explaining a case where the grounding plate extends getting clear of the crossing portion of the metal chassis;

FIG. 7 shows a table for comparison of an embodiment of the present invention to the prior art, with regard to their spurious interference characteristics;

DETAILED DESCRIPTION OF THE PREFERRED EMBODIMENTS

Figure 1:
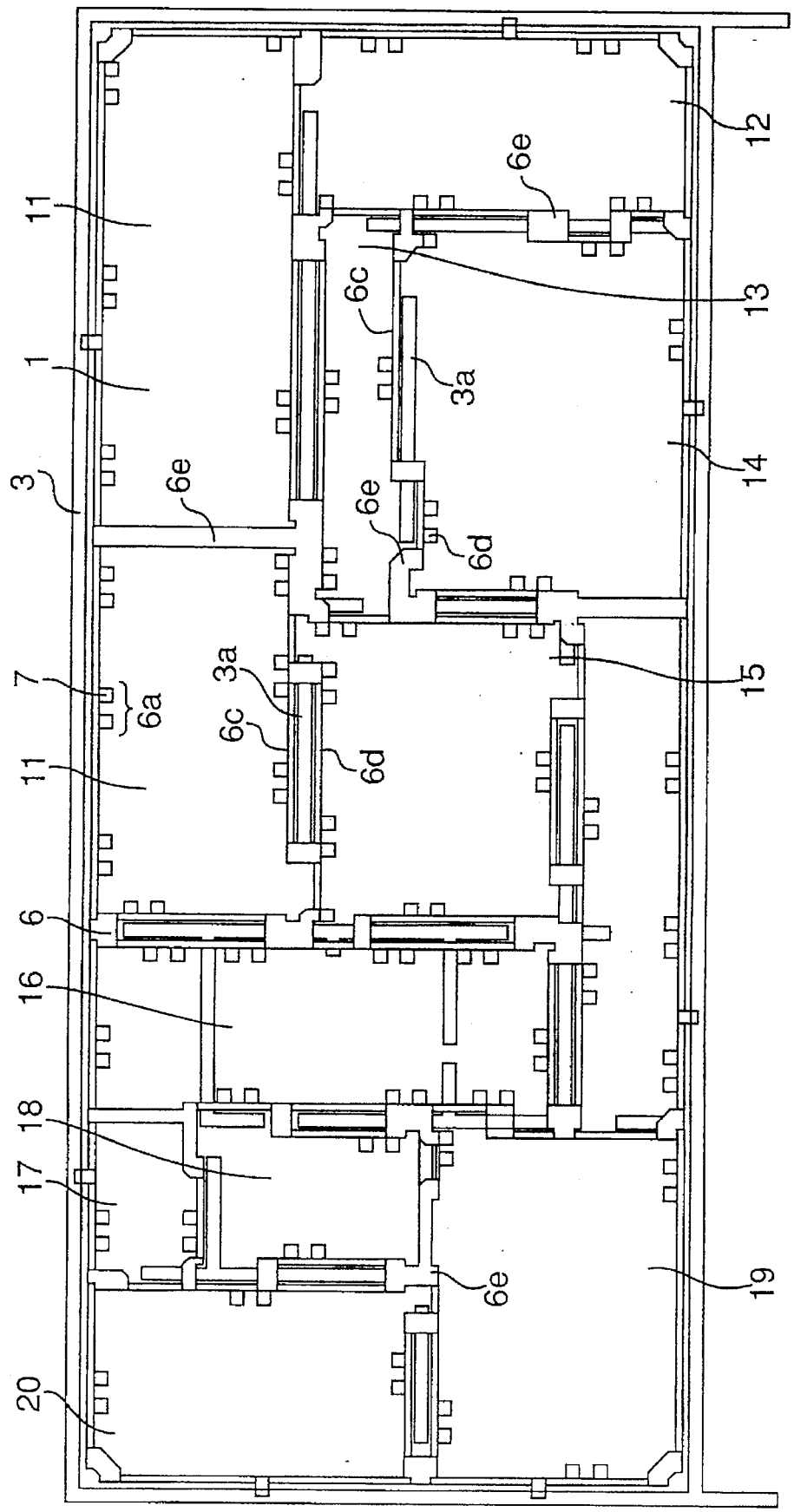
FIG. 1 is a plan view of an up-down tuner according to an embodiment of the present invention.
Figure 2:
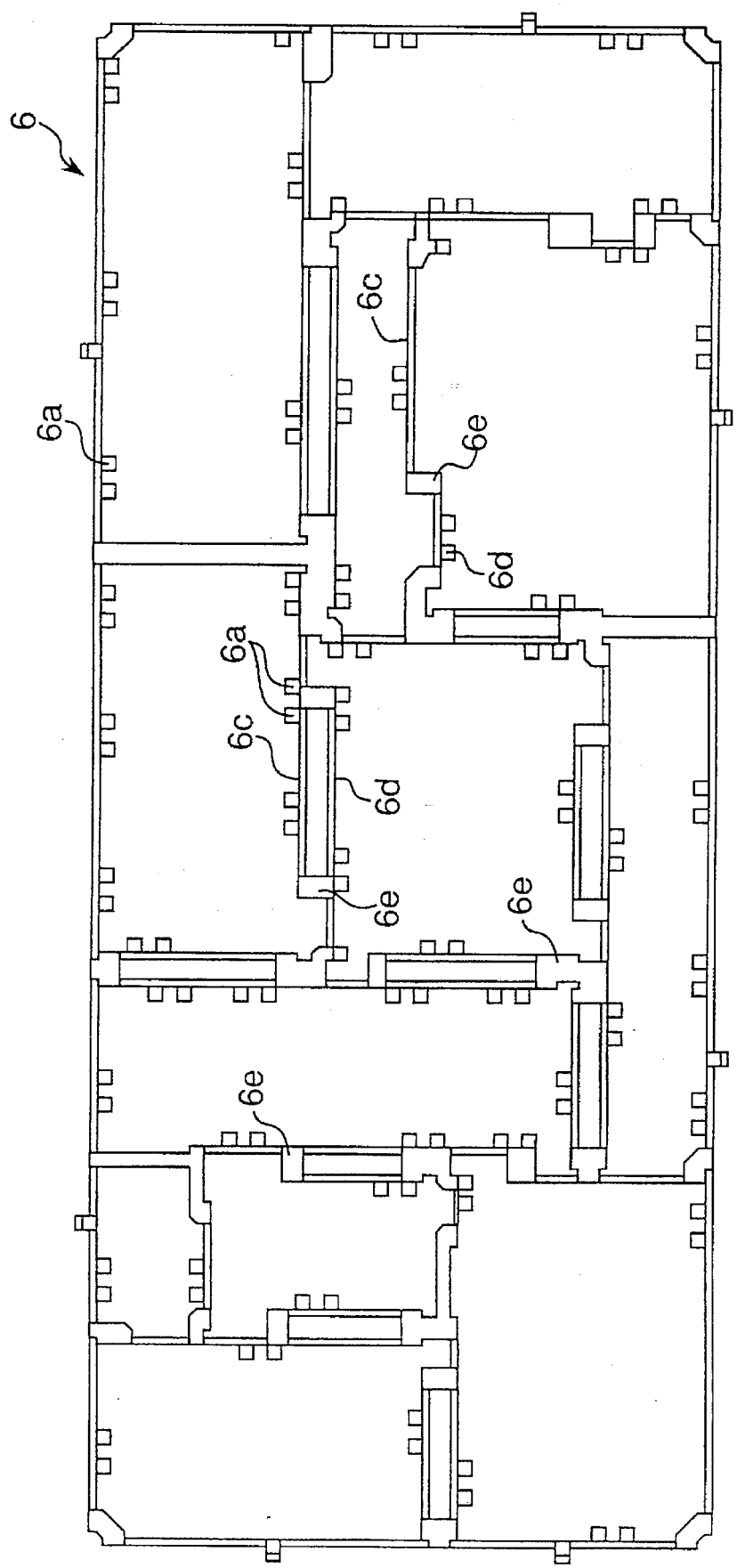
FIG. 2 is a plan view of a grounding plate for use in the up-down tuner shown in FIG. 1.

FIG. 1 shows the construction of an up-down tuner according to an embodiment of the present invention. FIG. 2 shows the construction of a grounding plate for use in the up-down tuner.

Figure 9:
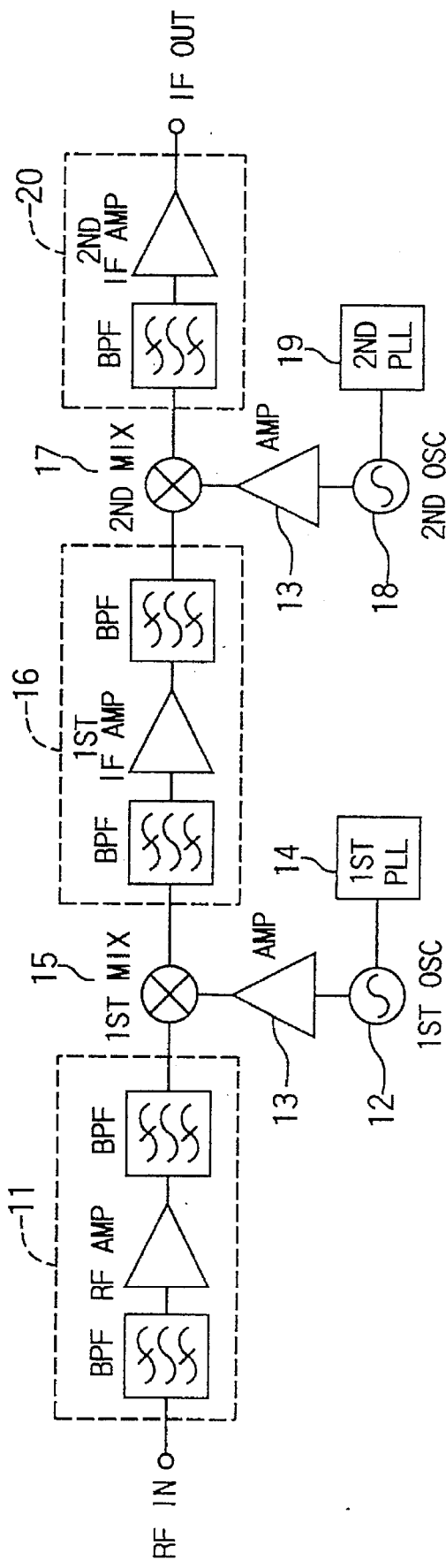
FIG. 9 is a block diagram showing a circuit construction of a prior art up-down tuner.
Figure 10:
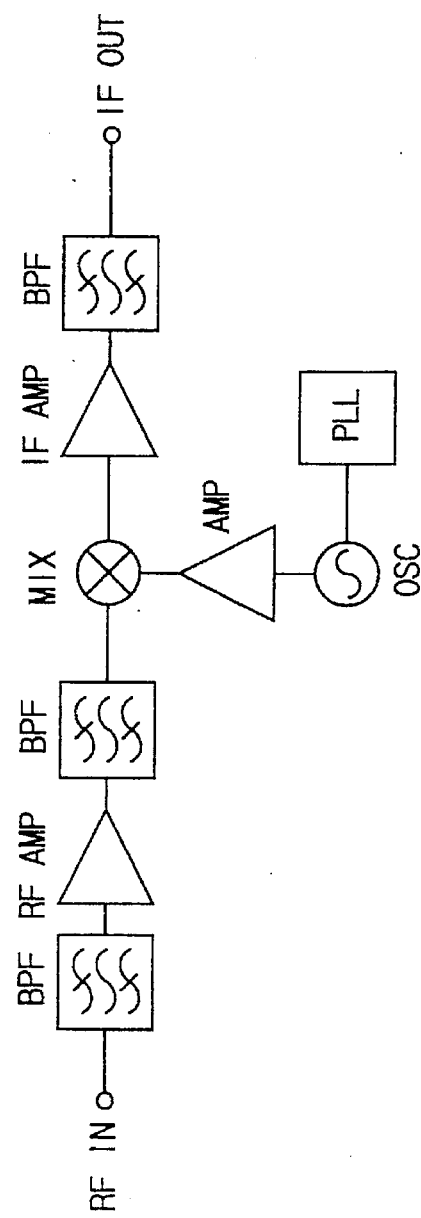
FIG. 10 is a block diagram of a generic tuner for comparison with the up-down tuner shown in FIG. 9.
Figure 11:
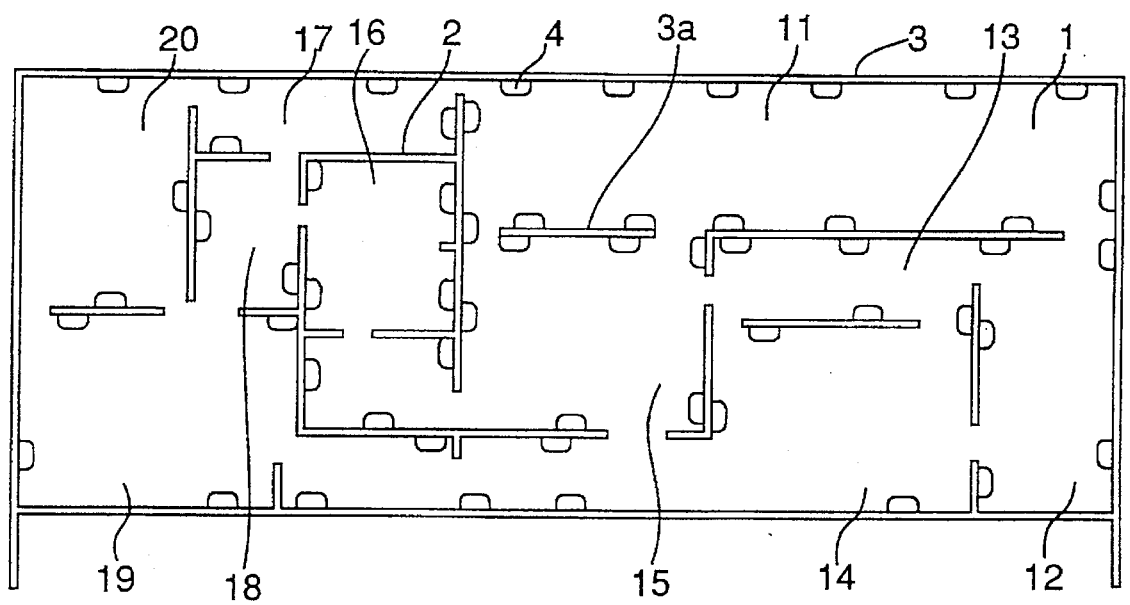
FIG. 11 is a plan view of the prior art up-down tuner.
Figure 12:
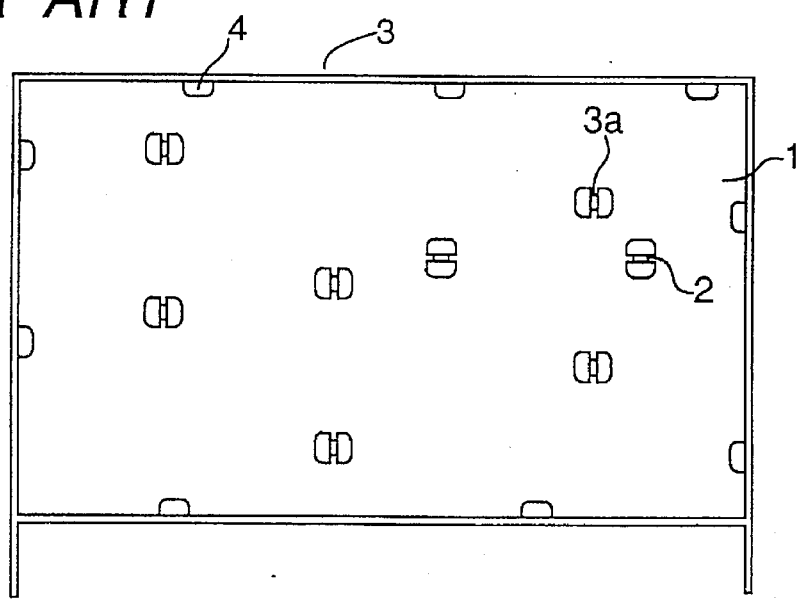
FIG. 12 is a plan view of the prior art generic tuner.
Figure 13A:
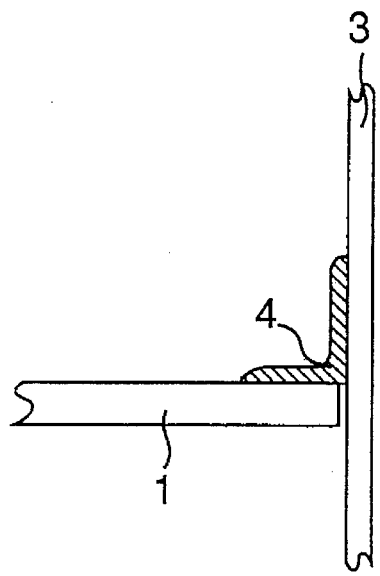
FIGS. 13A, 13B, 13C and 13D are sectional views for explaining prior art connection by solder between the printed wiring board and the metal chassis.
Figure 13B:
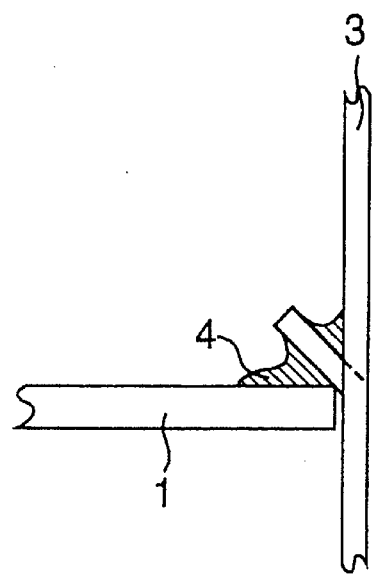
Figure 13C:
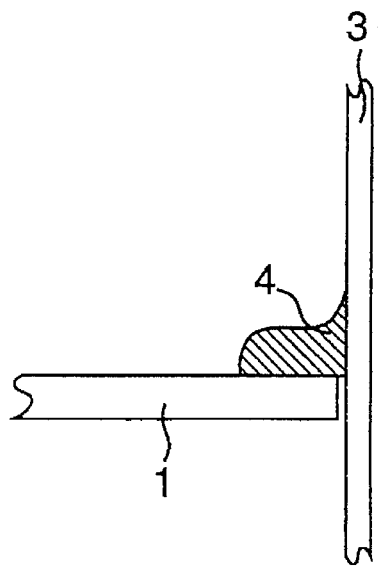
Figure 13D:
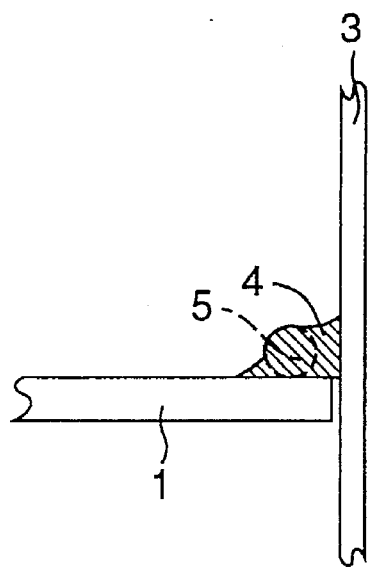

The present up-down tuner will be described hereinbelow in regard to aspects thereof which are different from the prior art up-down tuner shown in FIGS. 9 and 11. It is noted that components having the same functions as those of the prior art are denoted by the same reference numerals and characters.

In the present embodiment, instead of amassing solder or mounting dummy chips as in the prior art, a grounding plate 6 which is fitted to a metal chassis 3, even to a complicated one, is employed as shown in FIGS. 1 and 2 in order to suppress cost increase to a minimum.

Figure 3:
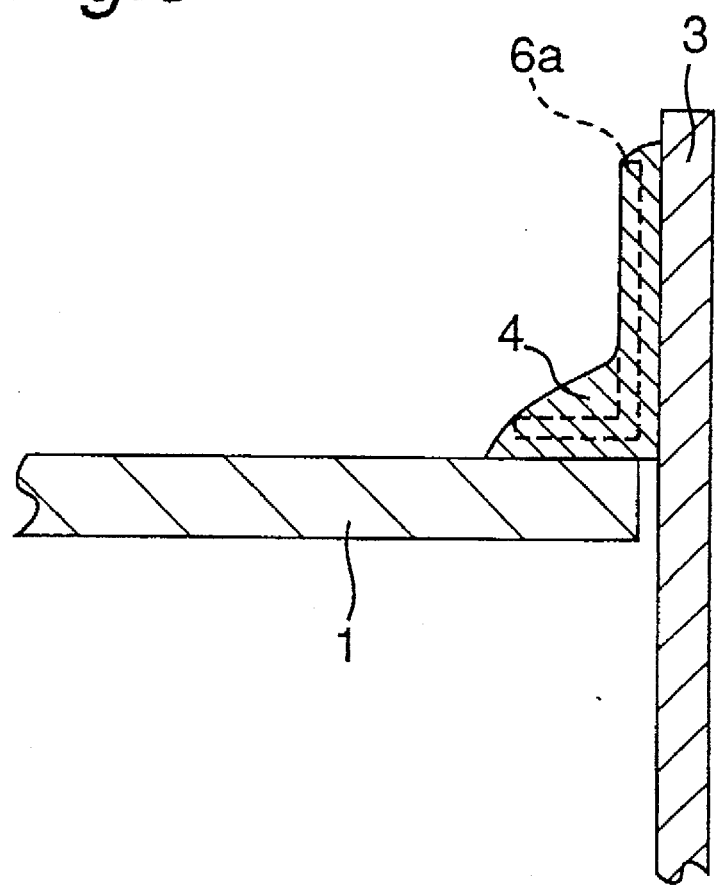
FIG. 3 is a sectional view for explaining a state of connection by solder between a printed wiring board and a metal chassis.

The grounding plate 6 has portions 6c and 6d for holding a shield section 3a of the metal chassis 3 from both sides as shown in FIGS. 4A through 4C, 5A through 5C and 6A through 6C, those portions being connected with each other via a connection portion 6e. The grounding plate 6 is assembled in the up-down tuner with the connection portion 6e inserted in an engagement recess portion 3c provided at the metal chassis 3. The grounding plate 6 has soldering portions 6a having a generally L-shaped profile for use in connection by solder between the metal chassis 3 and a printed wiring board 1. In the assembled state of the grounding plate 6, the soldering portions 6a each extend downwardly toward a copper foil portion (not shown) on the printed wiring board 1 along the shield section 3a of the metal chassis 3 and then bend at a lower portion. FIG. 3 shows a state in which the metal chassis 3 and the printed wiring board 1 are connected with each other by solder 4 via the soldering portion 6a. As apparent from FIG. 3, in the up-down tuner of the present embodiment, an area of the soldered portion and an amount of solder are increased more than in the prior art by employing the grounding plate 6 having the aforementioned configuration, so that the bonding strength of solder between the printed wiring board 1 and the metal chassis 3 is improved.

The grounding plate 6 is comprised of a one-piece grounding plate, and it is arranged so as to cover portions to be soldered in almost the entire area of the up-down tuner.

The grounding plate 6 may be made of any material so long as the material has a good solderability and a good workability. It can be formed of, for example, a tin plate.

In order to arrange the grounding plate 6 throughout almost the entire up-down tuner, there are circumstances where soldering is required on both the opposite sides of the metal chassis 3, or where the metal chassis 3 branches out, that is, where metal chassis 3 portions cross each other. Further, the crossing portion of the metal chassis 3 must be avoided.

Figure 4A:
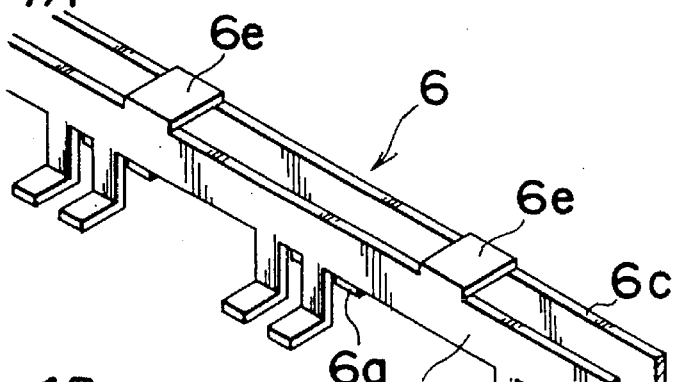
FIGS. 4A, 4B, and 4C are perspective views for explaining a state where the grounding plate holds a metal chassis from opposite sides of the metal chassis.
Figure 4B:
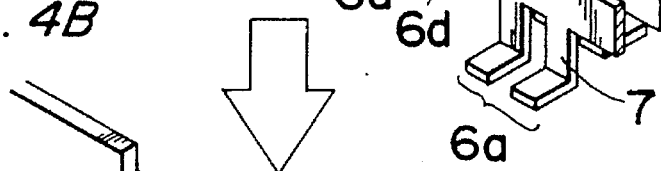
Figure 4C:
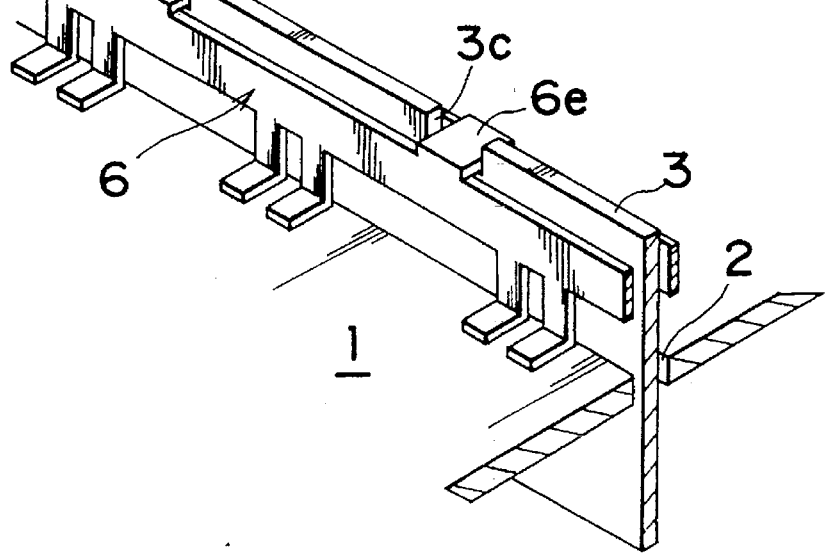

When soldering is required on both the opposite sides (the front and rear surfaces) of the metal chassis 3, soldering can be performed by arranging the grounding plate 6 so as to make the aforementioned portions 6c and 6d face each other and hold the metal chassis 3 with the facing portions, and providing the soldering portions 6a for each of the front and rear surfaces of the metal chassis 3 in a manner as shown in FIGS. 4A through 4C. Thus, the present invention can easily cope with soldering on the opposite sides of the metal chassis 3.

On the other hand, when a crossing portion 3d of the metal chassis 3 must be circumvented or gotten clear of, the grounding plate 6 can be arranged to avoid the crossing portion 3d of the metal chassis 3 by extending a part of the grounding plate 6 along only one side of the metal chassis 3 where there are no crossing portions, in a manner as shown in FIGS. 5A through 5C.

The above arrangement allows a single grounding plate to be located in correspondence with the portions to be soldered in almost the entire area of the up-down tuner.

Figure 6A:
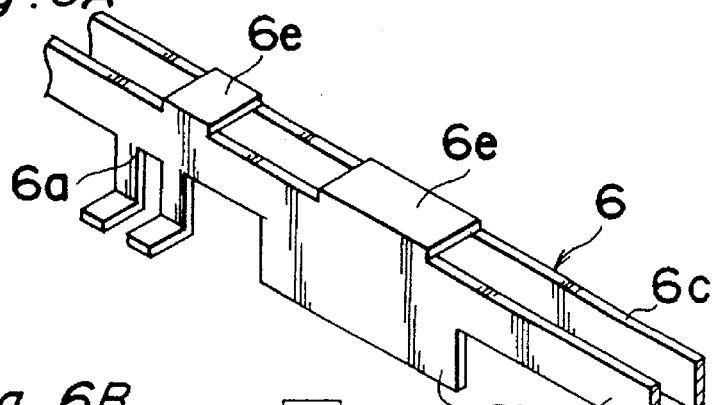
FIGS. 6A, 6B, and 6C are perspective views for explaining a case where a cutout portion of the metal chassis is shielded by a shield portion provided at the grounding plate.
Figure 6B:
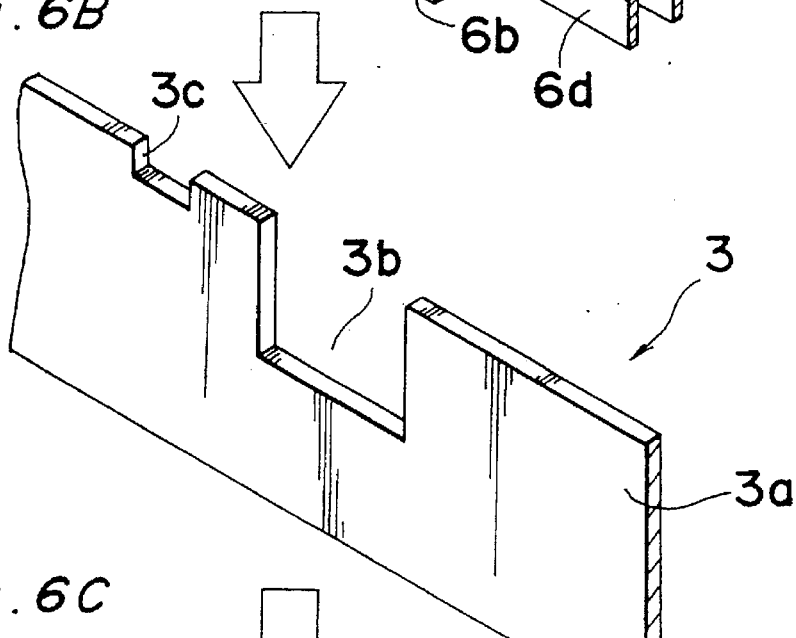
Figure 6C:
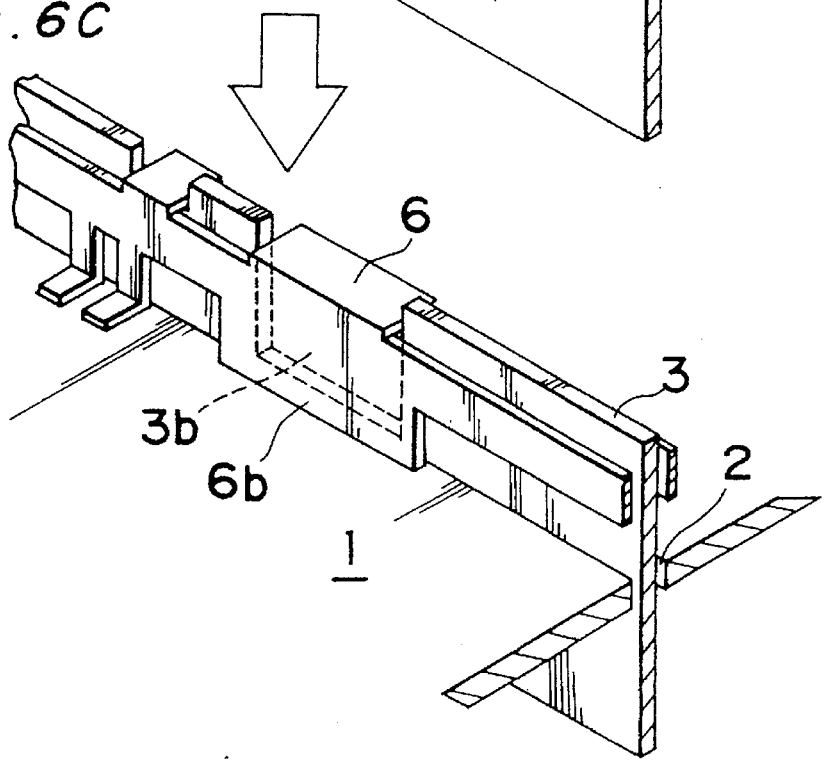

Furthermore, as shown in FIGS. 6A through 6C, the metal chassis 3 has in its shield section 3a, a cutout portion 3b for retaining the printed wiring board 1. By providing the grounding plate 6 with a shield portion 6b in positional correspondence with the cutout portion 3b for shielding the cutout portion 3b, the portion at which no shield has conventionally been provided can be shielded, thereby achieving a remarkably improved shielding effect. Also, by forming the grounding plate 6 with such a shield portion 6b at a portion to which the chassis cannot conventionally been extended, the shielding effect can be remarkably improved. Thus, the spurious interference characteristic is improved by 5 to 10 dB in the signal to interference ratio (S/I ratio) in each case, as shown in FIG. 7.

Practically, the up-down tuner of the present embodiment is substantially completely partitioned in sections as shown in FIG. 1. In FIG. 1, there are shown an RF (Radio Frequency) section 11, a first local oscillation section 12, a first local amplification section 13, a first local PLL (Phase Locked Loop) section 14, a first mixer section 15, a first IF (Intermediate Frequency) section 16, a second mixer section 17, a second local oscillation section 18, a second local PLL section 19, and a second IF section 20. At the above-mentioned sections, each portion at which no shield has conventionally been provided is shielded and thereby substantially completely partitioned by the shield portion 6b.

Conventionally, improvement of the spurious interference characteristic was attempted by consuming much time in examining the spurious interference and daringly sacrificing other performances of the device more or less. However, the aforementioned arrangement of the present invention obviates the need to take such measures. Therefore, other performances are also improved.

Figure 8A:
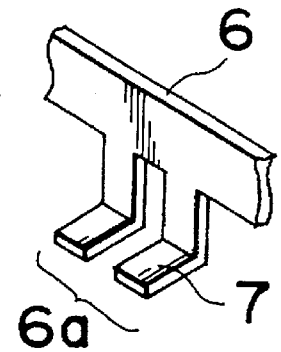
FIGS. 8A, 8B, 8C, 8D and 8E are perspective views of examples of a soldering portion of the grounding plate.
Figure 8B:
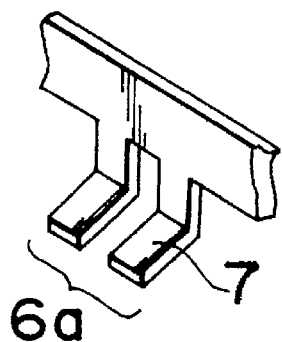
Figure 8C:
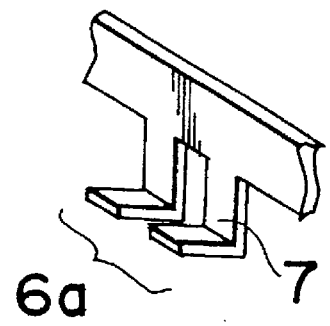
Figure 8D:
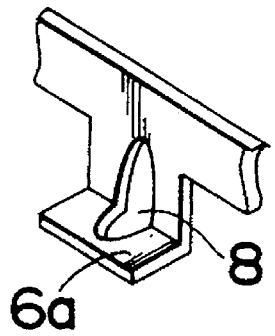
Figure 8E:
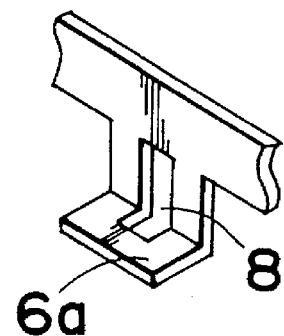

The soldering portion 6a of the grounding plate 6 can be formed by two separate nails 7 as shown in FIGS. 8A through 8C. In this case, solder is retained between the nails 7. Thus, the reliability of solder bonding between the printed wiring board 1 and the metal chassis 3 can be improved. The nails 7 can be formed in such a configuration that the approximately L-shaped profile thereof has an obtuse angle or an acute angle as shown in FIGS. 8B and 8C respectively. In this case, a gap is provided between the nails 7 and the printed wiring board 1 and solder is retained in the gap as well. Thus, the reliability of solder bonding can be improved. Otherwise, as shown in FIGS. 8D and 8E, it is acceptable to provide a through hole 8 having a circular shape including ellipse, a rectangular shape or the like in an approximately center position of the soldering portion 6a. Solder is retained in the through hole 8 so as to improve the reliability of the solder bonding. It is to be noted that the shape of the soldering portion 6a is not limited to the shapes shown in FIGS. 8A through 8E, and the soldering portion 6a may be of any shape so far as the soldering area and the amount of solder are increased.

According to the above-mentioned arrangement, as a result of a long-time reliability test of 500 hours, it was proved that a rate of occurrence of solder cracks, which were 50% when no countermeasure has been taken, could be reduced to 5% or less. Here, the long-time reliability test was a thermal shock test in which cooling at a temperature of −20° C. and heating at a temperature of 80° C. were repeated alternately in a cycle of 30 minutes and then it was checked whether or not a solder crack took place after 168 cycles or 500 cycles.

Is obvious from above, according to the present invention, a high-reliability, high-performance up-down tuner can be manufactured at relatively low costs.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An up-down tuner in which a printed wiring board is soldered to a metal chassis that penetrates a slit formed in the printed wiring board, comprising:

a grounding plate, engaged with the metal chassis, including at least one soldering portion having an approximately L-shaped profile, via which the printed wiring board and the metal chassis are soldered together, wherein the at least one soldering portion includes a through-hole.

2. The up-down tuner of claim 1, wherein the through-hole is of an approximately elliptic shape.

3. The up-down tuner of claim 1, wherein the through-hole is of an approximately rectangular shape.

4. The up-down tuner of claim 1, wherein the through-hole is included in the portion of the at least one soldering portion contacting the printed wiring board and the portion contacting the metal chassis.

5. An up-down tuner in which a printed wiring board is soldered to a metal chassis that penetrates a slit formed in the printed wiring board, comprising:

a grounding plate, engaged with the metal chassis, including at least one soldering portion having an approximately L-shaped profile, via which the printed wiring board and the metal chassis are soldered together, wherein the grounding plate includes a first portion extending along one side surface of the metal chassis, a second portion extending along the other side surface of the metal chassis, and a connection portion for connecting the first and second portions together, the connection portion being engaged with a corresponding portion of the metal chassis, and wherein the at least one soldering portion is formed at a lower end of at least one of the first and second portions.

6. The up-down tuner of claim 5, wherein the grounding plate includes at least two soldering portions, at least one soldering portion being formed at a lower end of each of the first and second portions.

7. The up-down tuner of claim 5, wherein the at least one soldering portion includes a through-hole.

8. The up-down tuner of claim 5, wherein the at least one soldering portion includes a base portion and a foot portion, the foot portion being at an acute angle with respect to the base portion.

9. The up-down tuner of claim 5, wherein the at least one soldering portion includes a base portion and a foot portion, the foot portion being at an obtuse angle with respect to the base portion.

10. The up-down tuner of claim 5, wherein the at least one soldering portion includes a base portion and a foot portion perpendicular to the base portion.

11. The up-down tuner of claim 5, wherein the at least one soldering portion includes two parallel base portions and two parallel feet portions approximately perpendicular to the two parallel base portions.

12. The up-down tuner of claim 5, wherein the metal chassis includes a cutout portion and the connection portion of the grounding plate is in positional correspondence to the cutout portion.

13. An up-down tuner in which a printed wiring board is soldered to a metal chassis that penetrates a slit formed in the printed wiring board, comprising:

a grounding plate, engaged with the metal chassis, including at least one soldering portion having an approximately L-shaped profile, via which the printed wiring board and the metal chassis are soldered together, wherein the metal chassis includes a cutout portion for retaining the printed wiring board, and the grounding plate includes a shield portion in positional correspondence to at least the cutout portion.

14. An up-down tuner in which a printed wiring board is soldered to a metal chassis that penetrates a slit formed in the printed wiring board, comprising:

a grounding plate, engaged with the metal chassis, including at least one soldering portion having an approximately L-shaped profile, via which the printed wiring board and the metal chassis are soldered together, wherein the soldering portion of the grounding plate includes two spaced nails.

15. A soldering plate for soldering a metal chassis to another element, comprising:

a first portion extending along a first surface of the metal chassis;

a second portion extending along a second surface of the metal chassis; and a connection portion for engagement with a corresponding portion of the metal chassis and for connecting the first and second portions together; and at least one approximately L-shaped soldering portion formed on at least one of the first and second portions.

16. The soldering plate of claim 15, wherein the soldering plate includes at least two soldering portions, one formed on each of the first and second portions.

17. The soldering plate of claim 15, wherein the at least one soldering portion includes a base portion and a foot portion, the foot portion being at an acute angle with respect to the base portion.

18. The soldering plate of claim 15, wherein the at least one soldering portion includes a base portion and a foot portion, the foot portion being at an obtuse angle with respect to the base portion.

19. The soldering plate of claim 15, wherein the at least one soldering portion includes a base portion and a foot portion perpendicular to the base portion.

20. The soldering plate of claim 15, wherein the at least one soldering portion includes two parallel base portions and two parallel feet portions approximately perpendicular to the two parallel base portions.

21. The soldering plate of claim 15, wherein the at least one soldering portion includes a through-hole.

* * * * *